United States Patent [19]
Liou

[11] Patent Number: 6,037,649
[45] Date of Patent: Mar. 14, 2000

[54] THREE-DIMENSION INDUCTOR STRUCTURE IN INTEGRATED CIRCUIT TECHNOLOGY

[75] Inventor: Ping Liou, Hsinchu, Taiwan

[73] Assignee: Winbond Electronics Corp., Hsinchu, Taiwan

[21] Appl. No.: 09/285,029

[22] Filed: Apr. 1, 1999

[51] Int. Cl.[7] .................................................. H01L 29/00
[52] U.S. Cl. ........................ 257/531; 336/65; 336/84 R; 336/139; 336/200; 336/225
[58] Field of Search .............................. 257/531; 336/69, 336/84 R, 84 C, 84 M, 139, 149, 180, 189, 200, 223, 225

[56] References Cited

U.S. PATENT DOCUMENTS

| | | |
|---|---|---|
| 5,095,357 | 3/1992 | Andoh et al. . |
| 5,446,311 | 8/1995 | Ewen et al. . |
| 5,541,442 | 7/1996 | Keil et al. ................................ 257/533 |

*Primary Examiner*—Ngân V. Ngô
*Attorney, Agent, or Firm*—Majestic, Parsons, Siebert & Hsue P.C.

[57] ABSTRACT

A three-dimension inductor structure formed in a conventional integrated circuit technology has a direction of magnetic field perpendicular to the normal direction of the substrate of an applied integrated circuit. Due to the direction of the magnetic field, the electromagnetic interference induced by the three-dimension inductor structure affects other components in the same integrated circuit slightly. The three-dimension inductor structure includes an N-turn coil. Each turn coil in the N-turn coil includes a first-level metal line, a second-level metal line and third-level metal line. The three levels of metal lines are separated from one another by isolating layers. Two nearby levels of metal lines are connected through via plugs in the isolating layers between them. The integral coil is accomplished by connecting the second-level metal line of the Nth turn coil to the third-level metal line of the (N+1)th turn coil. Using the three-dimension structure, an integrated circuit of the radio frequency application can achieve a well integration. The three-dimension inductor structure also has the advantages of high quality factor and high inductance.

9 Claims, 6 Drawing Sheets

THREE-DIMENSION INDUCTOR STRUCTURE IN INTEGRATED CIRCUIT TECHNOLOGY

FIELD OF INVENTION

The present invention relates to an electric inductor formed in a conventional integrated circuit technology and, more in particular, to an inductor with a three-dimension structure.

BACKGROUND OF INVENTION

It is well-known that integrated circuit (IC) technologies bring compact mechanical packaging and low manufacture cost for applied circuits. To date, many digital and analog circuits, including complex microprocessors and operational amplifiers, have been successfully implemented in silicon based integrated circuits. However, one field that remains a challenge to employ in IC technology is radio frequency (RF) circuits, such as those used in cellular telephones, wireless modems, and other types of communication equipment. This is due to the difficulty of producing an excellent inductor in IC technologies that is suitable for RF applications.

U.S. Pat. No. 5,446,311 describes an inductor employed in an IC technology, shown in FIGS. 1. A novel structure in the patent is a flat (two-dimension) and spiral layout. This structure has at least three levels of metal separated from one another by isolating layers, such as silicon oxide layers. Each metal level is connected to nearby levels of metal through via plugs formed in the isolating layers. The first metal level 1 has to be used as a cross-under to make a connection to the circled terminal 6 of the spiral structure, as shown in FIG. 1A. Except for the first metal level, the other metal levels are identical spiral metal patterns, and via plugs effectively shunt the metal levels. Thus, at least two levels of metal are used for the inductor turns, and provide at least two inductors connected in parallel to reduce direct current (DC) resistance. Obviously, the DC resistance can be further decreased by shunting more metal layers if extra wiring levels are offered by the technology. The disadvantages of the flat spiral inductor of the prior art are described as follows.

First, when an electric current flows through the flat spiral inductor of FIG. 1, an induced magnetic field of the flat spiral inductor perpendicular to the plane of the substrate occurs. The magnetic field of the flat spiral inductor will penetrate the surface of the substrate in wide area, and thus affect significantly other components disposed over the same substrate during circuit operation.

Second, the quality factor (Q) of one inductor is generally used to indicate the capability of the inductor. A high-Q inductor means an excellent inductor. The Q value of one inductor depends on frequency, inductance (L), capacitance and resistance associated with the inductor. In an inductor, series resistance (Rs) of total metal coil line and parasitic capacitance associated with the inductor structure (Cd) both degrade the Q value of the inductor. In the flat spiral inductor of the prior art, wide metal lines reduce the series resistance, but also increase the inductor area and the parasitic capacitance associated with the inductor structure. The larger inductor area limits the integrating of the applied IC. Besides, the parasitic capacitance associated with larger inductor area decreases the self-resonance frequency of the inductor. This limits the useful frequency range of the flat inductor. Therefore, the flat spiral inductor has an inherent limit in the width of the metal lines due to the geometric structure thereof.

Third, it is well-known that the inductance of one inductor increases with the coil turns of the inductor in unit length. In the flat spiral inductor of the prior art, the outer turn coil is always longer than the inner turn coil, and thus the resistance of the flat spiral inductor increases rapidly with the coil turn numbers increasing. Therefore, in order to increase inductance, a flat spiral inductor must use a large amount of metal lines and sacrifice the Q value thereof due to high resistance. Besides, a high-L inductor also brings a larger area. Therefore, there is a limit of integration for the circuit where a high-L flat spiral inductor is applied.

Substantially, the disadvantages and limits of the flat spiral inductor are resulted from the geometric structure thereof. Accordingly, an objective of the invention is to provide an inductor with a three-dimension structure different from the flat structure of the inductor of the prior art.

Another objective of the invention is to provide an inductor capable of achieving high quality factor, high inductance, well integration and slight electromagnetic interference when applied in an integrated circuit.

SUMMARY OF INVENTION

The present invention relates to a three-dimension inductor structure manufactured in a conventional integrated circuit technology, which achieves high quality factor, high inductance, well integration and slight electromagnetic interference when applied in an integrated circuit.

According to the invention, an inductor with a three-dimension structure has a direction of magnetic field perpendicular to the normal direction of an employed substrate. The inductor structure includes an N-turn coil. Each turn coil in the N-turn coil includes a first-level metal line, a second-level metal line and third-level metal line. The three levels of metal lines are separated from one another by isolating layers. Two nearby levels of metal lines are interconnected through via plugs in the isolating layer between them. The integral coil is accomplished by connecting the second-level metal line of the Nth turn coil to the third-level metal line of the (N+1)th turn coil.

According to the invention, a three-dimension inductor structure is provided. The inductor structure is formed over a substrate and has an N-turn coil, wherein the N is a nature number. A first isolating layer is disposed over the substrate. A normal direction is defined on the substrate. The inductor structure has a direction of magnetic field perpendicular to the normal direction of the substrate. Each turn coil in the N-turn coil comprises a first-level metal line, a second-level metal line and a third-level metal line. The first-level metal line is formed on the first isolating layer. The first-level metal line has a first end and a second end. The second-level metal line is separated from the first-level metal line by a second isolating layer. The second isolating layer has via plugs for providing connection for the first-level metal line. The second-level metal line has a first part and a second part respectively connected to the first and second ends of the first-level metal line through the via plugs in the second isolating layer. The third-level metal line is separated from the second-level metal line by a third isolating layer. The third isolating layer has via plugs for providing connection for the second-level metal line. The third-level metal line has a first end and a second end. The first end of the third-level metal line is connected to the first part of the second-level metal line through the via plugs in the third isolating layer. Differing to the flat (two-dimension) spiral inductor structure of the prior art, the three-dimension inductor structure, provided in the invention, has the same coil length in each turn coil. Therefore, in the condition of the same coil turns, the three-dimension inductor structure has less series resistance than the flat inductor structure, i.e., the three-dimension inductor structure has higher quality factor than the flat inductor structure. Further, the inductor of the invention has the direction of the magnetic field perpendicular to the normal direction of the substrate plane. Consequently, the induced magnetic field of the inductor of the invention affects other components in the same IC slightly. Furthermore, due to the extending of the three-dimension inductor only along the direction of the magnetic field rather than an area, the parasitic capacitance and the area associated with the inductor increase slowly. Thereby, the three-dimension inductor of the invention has high quality factor and high inductance at radio and microwave frequencies without the need to sacrifice the integration of the applied IC.

BRIEF DESCRIPTION OF THE APPENDED DRAWINGS

FIGS. 1A, 1B and 1C show the flat spiral inductor in accordance with U.S. Pat. No. 5,446,311.

DETAILED DESCRIPTION OF THE INVENTION

Figure 1A:
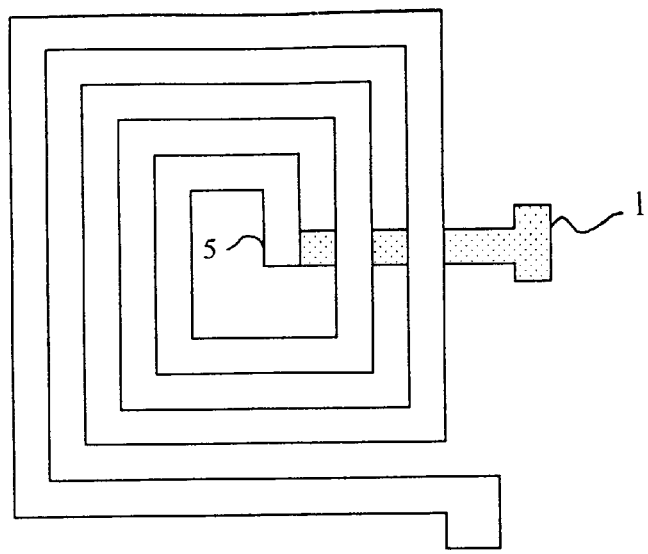
Figure 1B:
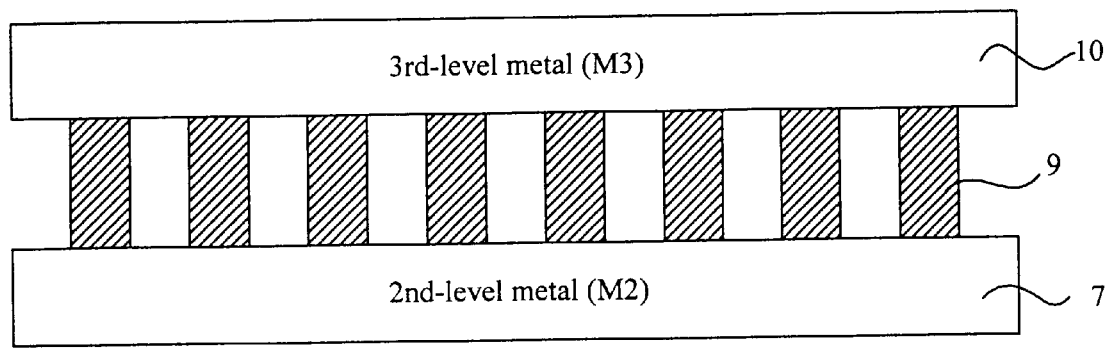
Figure 1C:
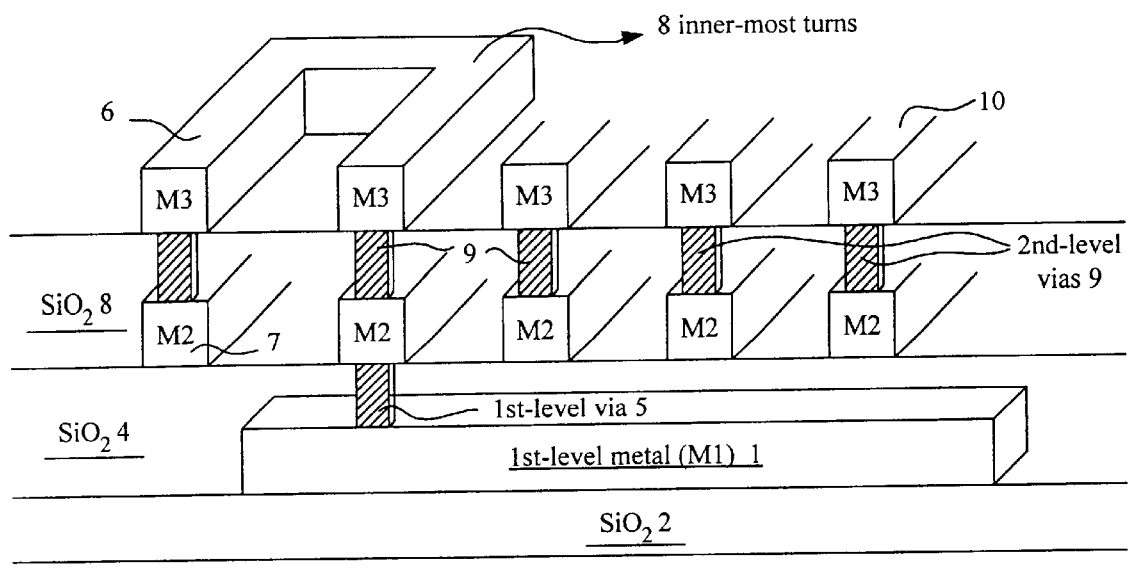
Figure 2A:
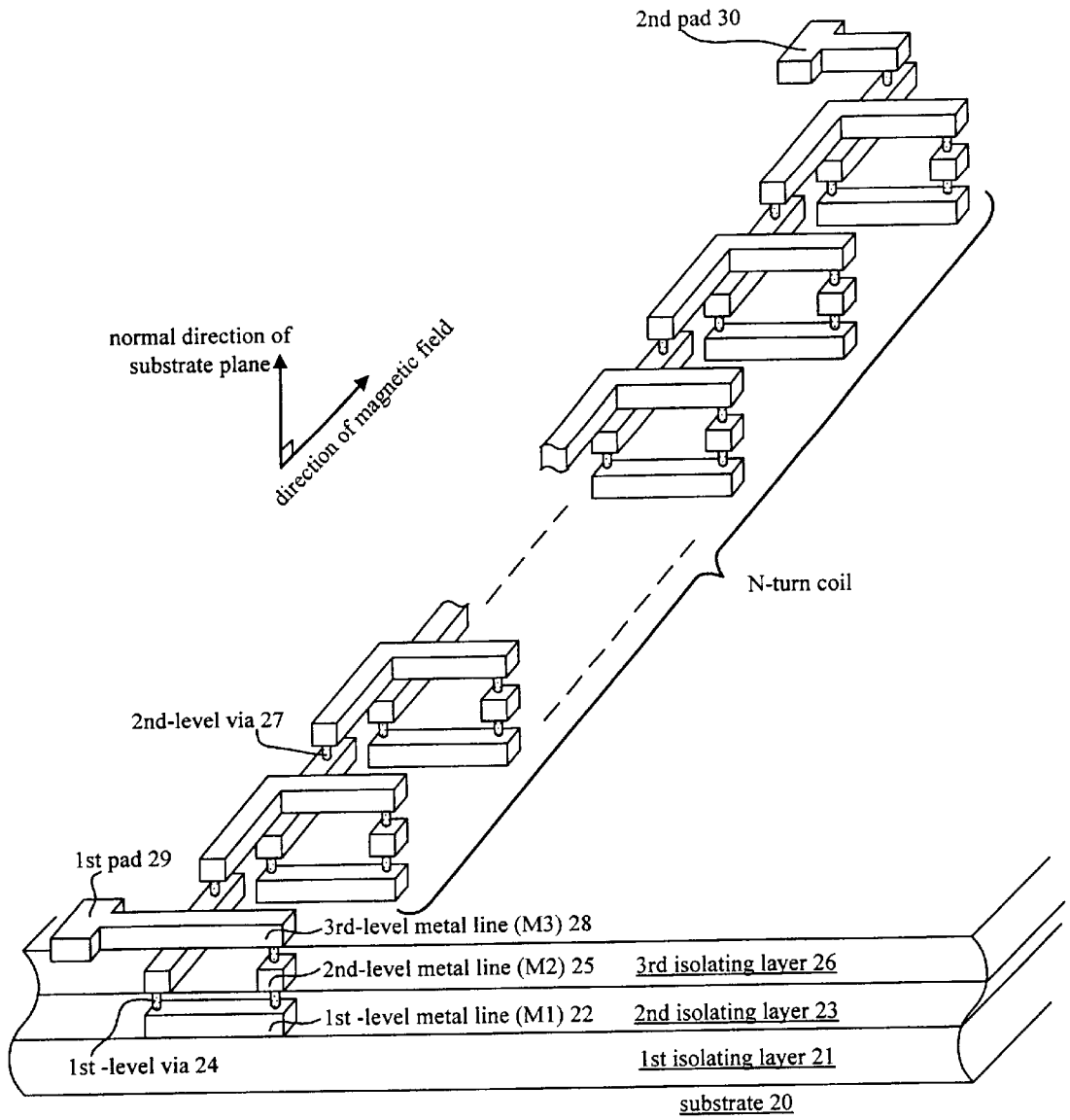
FIG. 2A shows the three-dimension inductor of the invention with an N-turn coil.

The invention provides an inductor with a three-dimension structure. Referring to FIG. 2A, the three-dimension helical inductor according to the invention is formed on a first isolating layer 21, such as a silicon oxide layer. For simplicity, the first isolating layer 21 is directly formed on a substrate 20. In practical application, the situation of the inductor together with the first isolating layer corresponding to the substrate is formed as intended. As shown in FIG. 2A, the inductor has an N-turn coil and a direction of magnetic field perpendicular to the normal direction of said substrate. The integral structure of the three-dimension helical inductor mainly includes three levels of metal lines (M1, M2 and M3) and three isolating layers (21, 23 and 26) such as silicon oxide layers. In particular, two arrays of vias are respectively formed through the second and third isolating layers (23 and 26), i.e., the first-level vias 24 and the second-level vias 27. All vias are filled with a metal to form via plugs. The three levels of metal lines (M1, M2 and M3) are separated from one another by the second and third isolating layers (23 and 26), but connected to nearby levels of metal lines through the via plugs (24 and 27) in the second and third isolating layers (23 and 26). In addition, the three-dimension inductor also includes a first pad 29 and a second pad 30 respectively connected to the first and last turn coils for provide connection with external circuits.

Figure 2B:
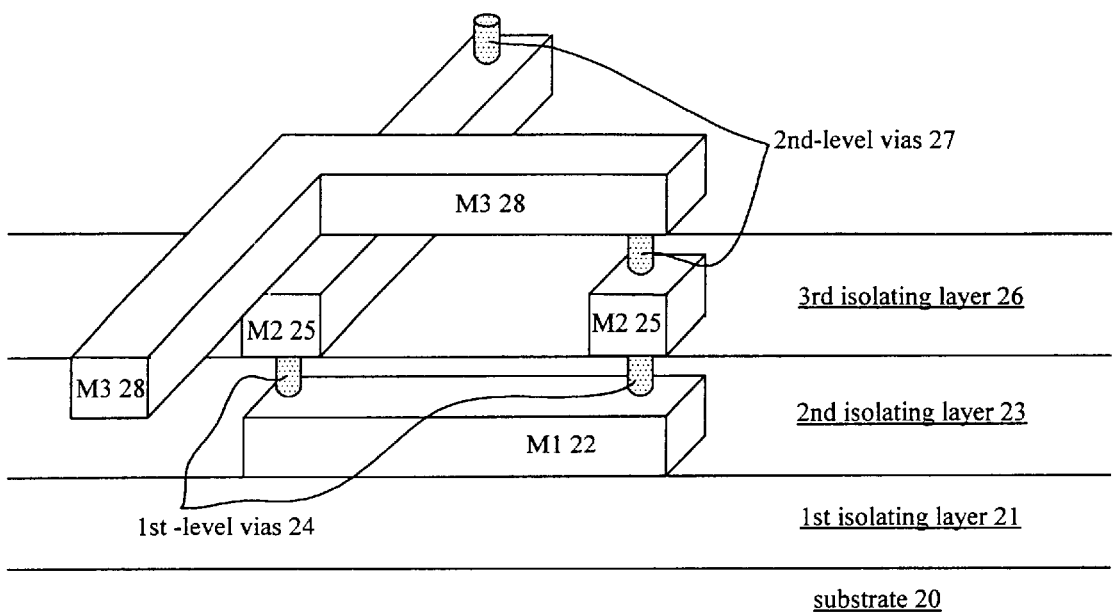
FIG. 2B shows the essential of each turn coil in the N-turn coil of the three-dimension inductor.

As show in FIG. 2B, each turn coil in the N-turn coil includes a first-level metal line (M1) having a first end and a second end, a second-level metal line (M2) having a first part and second part, and a third-level metal line (M3) having a first end and a second end. In each turn coil, the first and second parts of the second-level metal line (M2) are respectively connected to the first and second ends of the first-level metal line (M1), and the first end of the third-level metal line (M3) is connected to the first part of the second-level metal line (M2). In each turn coil, the second-level metal line (M2) also includes an extending body at the second part thereof, and the third-level metal line (M3) also includes an extending body at the second end thereof. The extending bodies all extend along the direction of the magnetic field of the three-dimension inductor. The integral coil of the three-dimension helical inductor is accomplished by connecting the extending body of the second-level metal line (M2) in the Nth turn coil with the extending body of the third-level metal line (M3) in the (N+1)th turn coil through the via plugs 27 in the third isolating layer 26.

In particular, the three-dimension inductor structure is fabricated in a monolithic IC technology. First, the first isolating layer 21 is formed on the substrate 20. The first-level metal lines (M1) are formed on the first isolating layer 21, and then covered with the second isolating layer 23 through which the first-level vias 24 are formed. Afterward, the second-level metal lines (M2) are formed on the second isolating layer 23, and then covered with the third isolating layer 26 through which the second-level vias 27 are formed. Finally, the third-level metal lines (M3) and the pads are formed on the third isolating layer 26.

Differing to the flat (two-dimension) spiral inductor structure of the prior art, the three-dimension helical inductor structure of the invention has the same coil length in each turn coil. Obviously, in the condition of the same coil turns, the three-dimension inductor structure has less series resistance than the flat inductor structure, i.e., the three-dimension inductor structure has higher Q value than the flat inductor structure. In particular, the inductor of the invention has the direction of the magnetic field perpendicular to the normal direction of the substrate plane. Therefore, the induced magnetic field of the inductor of the invention affects other components in the same IC slightly. Due to the extending of the three-dimension inductor only along the direction of the magnetic field rather than an area, the parasitic capacitance and the area associated with the inductor increase slowly. Thereby, the three-dimension inductor of the invention has high Q and high L at radio and microwave frequencies without the need to sacrifice the integration of the applied IC.

Figure 3A:
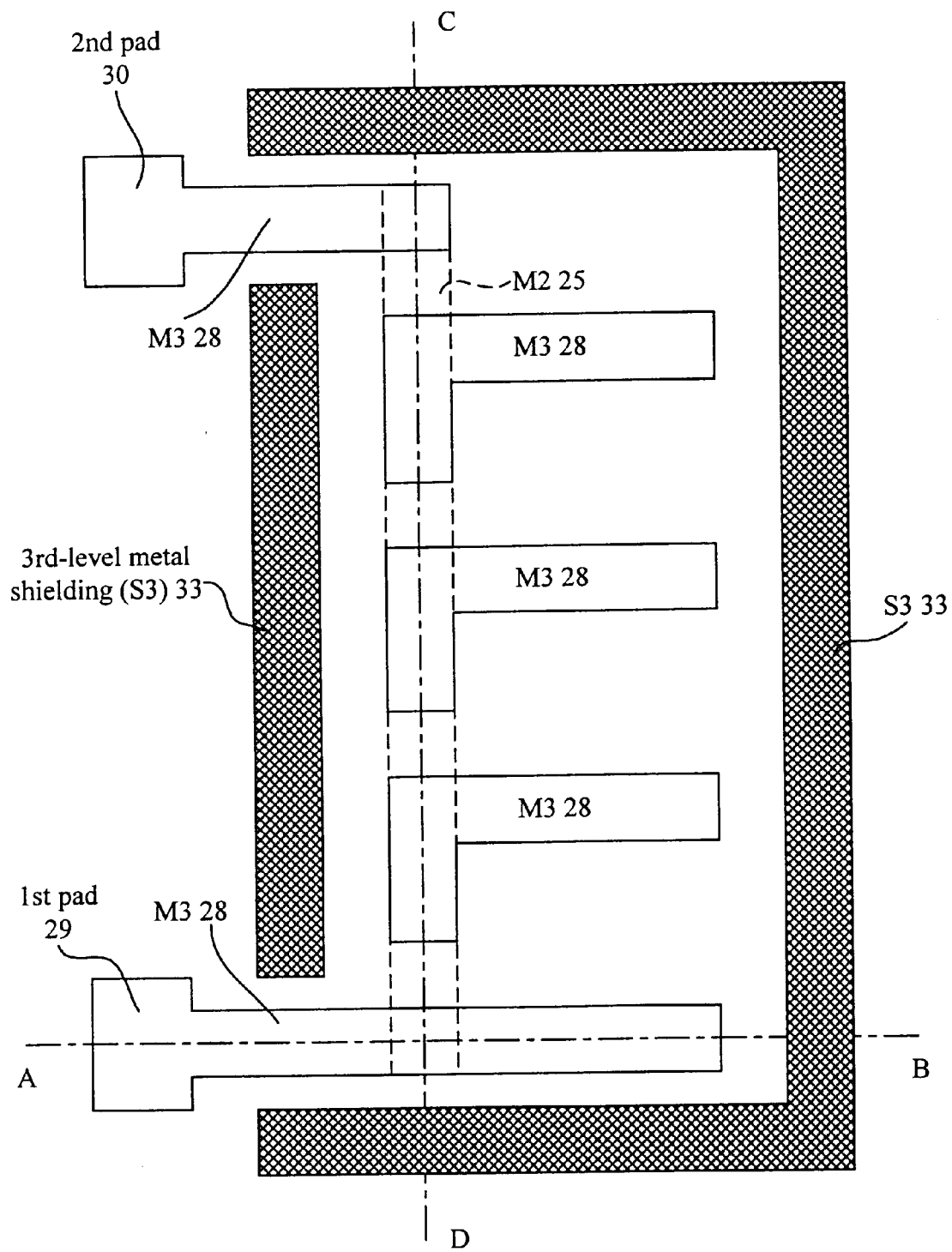
FIG. 3A shows the three-dimension inductor of the invention together with a shielding metal ring.
Figure 3B:
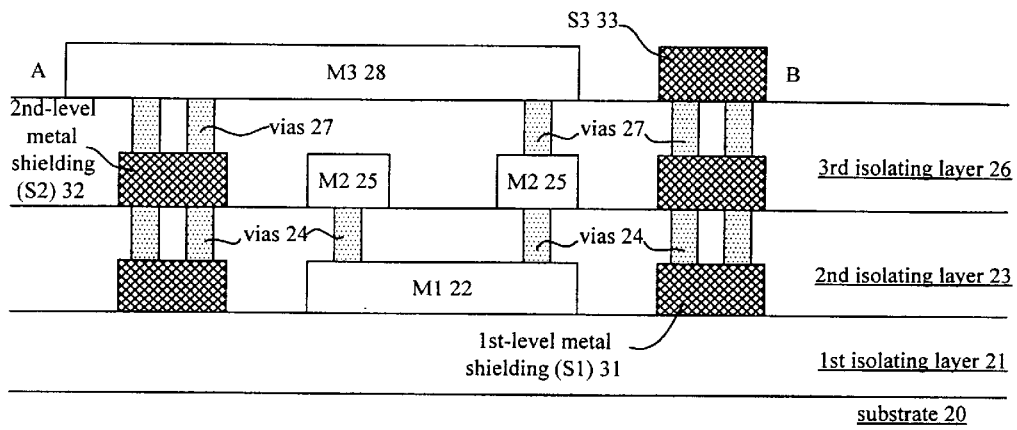
FIG. 3B shows the cross section view of the inductor in FIG. 3A along A–B line.
Figure 3C:
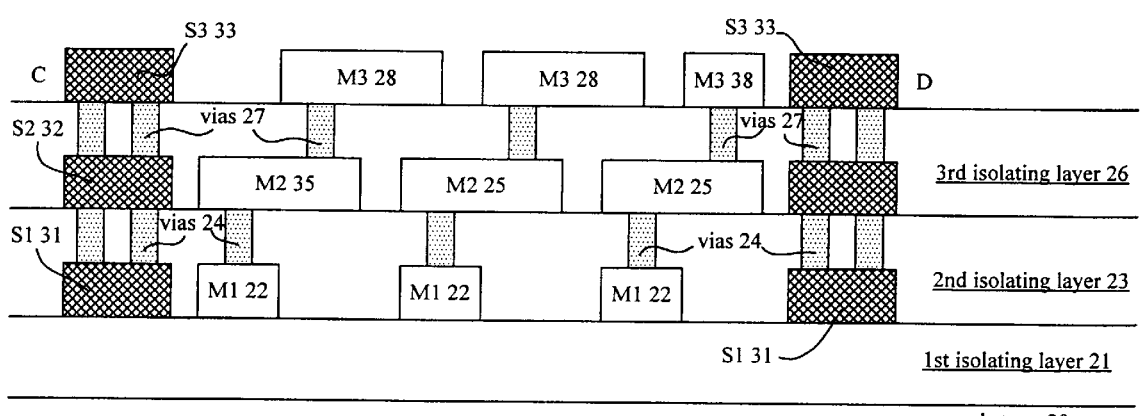
FIG. 3C shows the cross section view of the inductor in FIG. 3A along C–D line.

In another embodiment, the inductor of the invention is together with a metal shielding ring formed in monolithic technology. FIG. 3A shows the top view of the three-dimension helical inductor layout and metal shielding ring connected to a ground. The inductor with a three-turn coil is surrounded by the grounded metal shielding ring which can protect the inductor from electromagnetic interference from other circuits. FIG. 3B and FIG. 3C show the cross section view of the inductor together with the metal shielding ring in FIG. 3A along A–B line and C–D line, respectively. The metal shielding ring includes three levels of metal shielding rings (S1, S2 and S3). In monolithic technology, three levels of metal shielding rings (S1, S2 and S3) are respectively formed at the same levels as the metal lines (M1, M2 and M3) in the inductor. The first-level metal shielding ring S1 is also formed the first isolating layer 21. The first-level metal shielding ring S1 is separated from the second-level metal shielding ring S2 by the second isolating layer 23. The second-level metal shielding ring S2 is separated from the third-level metal shielding ring S3 by the third isolating layer 26. Two nearby levels of metal shielding rings are interconnected through the via plugs in the isolating layer between them, i.e., S1 is interconnected with S2 through the via plugs 24 in the second isolating layer 23, and S2 is interconnected with S3 through the via plugs 27 in the third isolating layer 26.

What is claimed is:

1. A three-dimension inductor structure formed over a substrate having an N-turn coil, the N being a nature number, a first isolating layer being disposed over said substrate, a normal direction being defined on said substrate, said inductor structure having a direction of magnetic field perpendicular to the normal direction of said substrate, each turn coil in the N-turn coil comprising:

a first-level metal line formed on the first isolating layer, said first-level metal line having a first end and a second end;

a second-level metal line, said second-level metal line being separated from said first-level metal line by a second isolating layer, the second isolating layer having via plugs for providing connection for said first-level metal line, said second-level metal line having a first part and a second part respectively connected to the first and second ends of said first-level metal line through the via plugs in the second isolating layer;

a third-level metal line, said third-level metal line being separated from said second-level metal line by a third isolating layer, the third isolating layer having via plugs for providing connection for said second-level metal line, said third-level metal line having a first end and a second end, the first end of said third-level metal line being connected to the first part of said second-level metal line through the via plugs in the third isolating layer.

2. The inductor structure of claim 1, wherein said second-level metal line in each turn coil includes an extending body at the second part thereof, said third-level metal line in each turn coil includes an extending body at the second end thereof, the extending body of said second-level metal line in the Nth turn coil is connected to the extending body of said third-level metal line in the (N+1)th turn coil through the via plugs in the third isolating layer.

3. The inductor structure of claim 2, further comprising a first pad and a second pad respectively connected to the first turn coil and the last turn coil of the N-turn coil for providing connection with external circuits.

4. A three-dimension helical inductor structure formed over a substrate having an N-turn coil and a metal shielding ring surrounding the N-turn coil, the N is a nature number, a first isolating layer being disposed over said substrate, each turn coil in the N-turn coil comprising:

a first-level metal line formed on the first isolating layer, said first-level metal line having a first end and a second end;

a second-level metal line, said second-level metal line being separated from said first-level metal line by a second isolating layer, the second isolating layer having via plugs for providing connection for said first-level metal line, said second-level metal line having a first part and a second part respectively connected to the first and second ends of said first-level metal line through the via plugs in the second isolating layer;

a third-level metal line, said third-level metal line being separated from said second-level metal line by a third isolating layer, the third isolating layer having via plugs for providing connection for said second-level metal line, said third-level metal line having a first end and a second end, the first end of said third-level metal line being connected to first part of said second-level metal line through the via plugs in the third isolating layer.

5. The inductor structure of claim 4, wherein said second-level metal line in each turn coil includes an extending body at the second part thereof, said third-level metal line in each turn coil includes an extending body at the second end thereof, the extending body of said second-level metal line in the Nth turn coil is connected to the extending body of said third-level metal line in the (N+1)th turn coil through the via plugs in the third isolating layer.

6. The inductor structure of claim 4, wherein said metal shielding ring comprises three levels of metal rings respectively formed at the same levels as the metal lines in said coil, the three levels of metal rings are separated from one another by said second and third isolating layers, and nearby levels of metal rings are interconnected through via plugs in the second and third isolating layers respectively.

7. The inductor structure of claim 4, further comprising a first pad and a second pad respectively connected to the first turn coil and the last turn coil of the N-turn coil for providing connection with external circuits.

8. A method for manufacturing a three-dimension inductor structure formed over a substrate, said inductor structure having an N-turn coil, the N is a nature number, each turn coil in the N-turn coil comprising a first-level metal line having a first end and a second end, a second-level metal line having a first part and second part, and a third-level metal line having a first end and a second end, the first and second parts of said second-level metal line in each turn coil being respectively connected to the first and second ends of said first-level metal line in the same turn coil, the first end of said third-level metal line in each turn coil being connected to the first part of said second-level metal line in the same turn coil, the second end of said third-level metal line in the (N+1)th turn coil being connected to the second part of said second-level metal line in the Nth turn coil, said method comprising the steps of:

forming a first isolating layer disposed over said substrate;

forming said first-level metal line of each turn coil on the first isolating layer;

forming a second isolating layer overlaying all first-level metal lines;

forming via plugs in the second isolating layer for providing connection for all first-level metal lines;

forming said second-level metal line of each turn coil on the second isolating layer, and connecting the first and second parts of said second-level metal line of each turn coil to the first and second ends of said first-level metal line of the same turn coil respectively through the via plugs in the second isolating layer;

forming a third isolating layer overlaying all second-level metal lines;

forming via plugs in the third isolating layer for providing connection for all second-level metal lines;

forming said third-level metal line of each turn coil on the third isolating layer, and connecting the first end of said third-level metal line of the Nth turn coil to the first part of said second-level metal line of the Nth turn coil and the other end to the second part of said second-level metal line of the (N+1)th turn coil through the via plugs in the third isolating layer.

9. The method of claim 8, wherein said inductor structure further comprises a first pad and a second pad respectively connected to the first turn coil and the last turn coil of the N-turn coil for providing connection with external circuits.

* * * * *